(12) United States Patent
Tietze et al.

(10) Patent No.: US 6,698,118 B2
(45) Date of Patent: Mar. 2, 2004

(54) PLATE

(75) Inventors: Martin Tietze, Eisenach (DE); Peer Quendt, Eisenach (DE); Frank Gotthardt, Eisenach (DE)

(73) Assignee: Fer Fahrzeugelektrik GmbH, Eisenach (DE)

( * ) Notice: Subject to any disclaimer, the term of this patent is extended or adjusted under 35 U.S.C. 154(b) by 0 days.

(21) Appl. No.: 10/158,218

(22) Filed: May 31, 2002

(65) Prior Publication Data

US 2002/0178627 A1 Dec. 5, 2002

(30) Foreign Application Priority Data

| Jun. 1, 2001 | (DE) | 201 09 237 U |
| Jan. 28, 2002 | (DE) | 202 01 224 U |

(51) Int. Cl.$^7$ .............................................. G09F 13/08
(52) U.S. Cl. ............................ 40/205; 40/544; 40/204
(58) Field of Search .................... 40/544, 591, 200, 40/204, 205, 208, 910

(56) References Cited

U.S. PATENT DOCUMENTS

| 4,457,089 A | | 7/1984 | Phillips, Jr. | |
| 4,466,208 A | | 8/1984 | Logan, Jr. et al. | |
| 4,603,065 A | | 7/1986 | Mori et al. | |
| 5,008,142 A | * | 4/1991 | Wilson et al. | 40/205 |
| 5,339,550 A | * | 8/1994 | Hoffman | 40/544 |
| 5,485,145 A | * | 1/1996 | Sniff | 40/544 |
| 5,497,572 A | * | 3/1996 | Hoffman | 40/544 |
| 5,533,289 A | * | 7/1996 | Hoffman | 40/544 |
| 5,692,327 A | * | 12/1997 | Wynne et al. | 40/205 |
| 6,142,643 A | * | 11/2000 | Araki et al. | 40/544 |

FOREIGN PATENT DOCUMENTS

| DE | 26 24 931 A1 | 12/1977 |
| DE | 41 22 118 A1 | 1/1993 |
| DE | 195 13 185 A1 | 10/1996 |
| DE | 195 16 488 A1 | 11/1996 |
| DE | 297 12 954 U1 | 11/1997 |

* cited by examiner

*Primary Examiner*—Gary Hoge
(74) *Attorney, Agent, or Firm*—Sughrue Mion, PLLC

(57) ABSTRACT

A plate such as a motor vehicle licence plate comprises a casing which includes a flat rear wall surrounded by a forwardly projecting edge defining a light transmission opening, through which a flat symbol carrier extending parallel to the rear wall of the casing is visible. The symbol carrier has regions of differing transparency to represent symbols thereon. An electrically activatable light film between the rear wall and the symbol carrier shines light through the symbol carrier from the rear. To provide retroreflective properties, arranged in front of the light film and parallel thereto is a film which extends at least over considerable parts of the area of the light transmission opening and which is at least partially transparent for the light from the rear and which is retroreflective for light impinging thereon from the exterior. A light cover which is transparent at least in region-wise manner closes the light transmission opening. A rough layer is provided between the inward surface of the light cover and the surface that is theretowards of the retroreflective film.

15 Claims, 2 Drawing Sheets

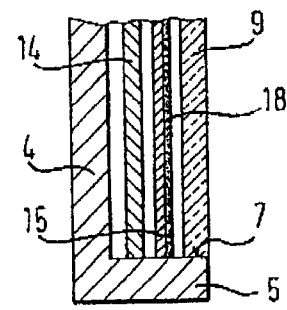
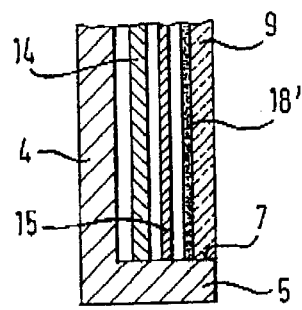
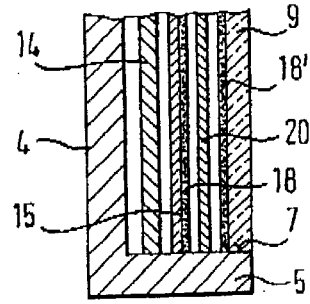

PLATE

FIELD OF THE INVENTION

The invention concerns a plate, for example a motor vehicle licence plate.

BACKGROUND OF THE INVENTION

One form of motor vehicle licence plate as is to be found in German utility model No 297 12 954.6 comprises a casing which has a flat rear wall and a forwardly projecting rim which extends around the edge of the rear wall. The rim defines a light transmission opening, through which it is possible to see a flat symbol carrier which extends parallel to the rear wall of the casing. The symbol carrier has regions of varying transparency to represent symbols thereon. To provide light between the rear wall and the symbol carrier, the plate has an electrically activatable light film which shines light through at least the regions of high transparency of the symbol carrier, from the rear thereof. The symbol carrier is formed by a stiff plastic plate member arranged in the casing which serves as a form of holding frame. The light film can be more particularly in the form of an electroluminescence film. The light transmission opening through which the light produced by the light film when activated issues to the exterior after having shone through the symbol carrier from the rear does not have any further closure so that the symbol carrier can be readily held securely by the projecting rim of the casing, by virtue of the stiffness of the symbol carrier, and thereby also fixes the light foil which is disposed behind it.

That design configuration enjoys advantages insofar as the electrically activatable light film provides for direct lighting of the background of the identification symbols without any need for a separately arranged lighting system. This means that the licence plate can be of an extremely compact and space-saving configuration.

It does however suffer from the disadvantage that there are no stiff plastic plate members, that is to say which are suitable as a closure for the light transmission opening, which are not only transparent for the light produced by the light foil and thus coming from the rear, while at the same time also being retroreflective for extraneous light which is incident on the symbol carrier from the exterior. This is a factor which is generally required by legislation in this respect, in particular for motor vehicle licence plates, but which is also an advantageous consideration or is required for other plates, for example traffic signs.

SUMMARY OF THE INVENTION

An object of the present invention is to provide a plate such as a vehicle licence plate which combines incorporated lighting by means of an electrically activatable light film and retroreflective properties.

Another object of the present invention is to provide a plate which incorporates its own lighting means and also affords retroreflective properties while affording an at least substantially uniform lighting effect.

Yet another object of the present invention is to provide a vehicle licence plate which affords a high level of retroreflectivity in conjunction with mechanical strength and stability.

In accordance with the principles of the present invention, the foregoing and other objects are attained by a plate such as a motor vehicle registration licence plate, comprising a casing which includes an at least substantially flat rear wall and an edge portion which extends around said rear wall and which projects forwardly therefrom. The edge portion defines a light transmission opening, through which it is possible to see a flat symbol carrier extending parallel to the casing rear wall. The symbol carrier has regions of varying transparency to represent the symbols thereon. To provide illumination between the rear wall and the symbol carrier, the plate has an electrically activatable light foil or film which shines light at least through the regions of high transparency of the symbol carrier, from the rear thereof. Arranged in front of the light film and in parallel relationship therewith is a further film which extends at least over a considerable part of the area of the light transmission opening and which is at least partially transparent for the light coming from the rear from the light film and which is retroreflective for light passing from the exterior through the light transmission opening and incident thereon. The plate further includes a light cover which closes the light transmission opening and which is transparent at least in a region-wise manner. A rough layer is provided between the inside of the light cover and the surface that is theretowards of the retroreflective film.

It will be noted in relation to this structure that plastic materials are available on the market, for example the film offered by 3M under the trade mark 3M SCOTCHLITE, which are substantially transparent in relation to light which impinges on the rear side thereof while they provide for retroreflection of light incident on their front side. As however those films do not enjoy any inherent stiffness they cannot serve as a closure panel to close the light transmission opening of the housing, as is the case with the symbol carrier of German utility model No 297 12 954.6 as discussed hereinbefore.

Therefore, in order to stabilise the electrically activatable light film and the retroreflective film arranged in front thereof, in terms of the flat contact thereof against the inside surface of the rear wall of the casing, it is necessary for the light transmission opening to be closed by a light cover which is transparent in relation to light in both directions and which thus primarily performs a mechanical holding function.

Without further measures being entailed in this respect however the problem which then arises is that the retroreflective film, in regard to its flat contact, bears against the inside of the light cover in an unevenly close relationship therewith over the entire surface area and is in part even sucked thereagainst so that, even when the system enjoys uniform illumination from the inside or the outside, it nonetheless still involves zones of varying lightness and darkness, or the formation of Newton's rings. That is not only unattractive but it is also inadmissible in particular in the case of motor vehicle licence plates. In accordance with the invention, to overcome those difficulties, a rough layer is provided between the inside of the light cover and the surface that is theretowards of the retroreflective film.

The rough layer can be implemented in different ways. Thus, in accordance with a preferred feature of the invention, arranged between the retroreflective film and the light cover is a further film which is rough on both sides and which enjoys very high transparency in both directions therethrough and which prevents the retroreflective film from being able to bear against the inside surface of the light cover so snugly that the above-mentioned optical interference effects occur. The retroreflective film can then have a completely smooth surface and the inside surface of the light cover can also be smooth.

As an alternative to that additional rough film it is also possible for the rough layer in accordance with the invention to be afforded by a rough coating either on the outwardly facing surface of the retroreflective film and/or on the inwardly facing surface of the light cover.

A particular advantage of the plate according to the invention is that a separate symbol carrier is now no longer absolutely necessary. On the contrary, the symbols to be represented on the plate can be provided on any of the surfaces which, as viewed by a person viewing the plate, are in front of the rear surface of the retroreflective film, that is to say on the front side of the retroreflective film, the rear side or the front side of the film which is rough on both sides, or the front side or the rear side of the light cover. In that respect there is no need for all symbols which are to be represented to be disposed on the same surface.

In another preferred feature of the invention the symbols of the symbol carrier can be provided on one or more of the film surfaces as it is very easy to print the symbols thereon.

In accordance with yet another preferred feature of the invention the films can bear loosely against each other between the rear wall of the casing and the light cover, and can be held by the rear wall and the light cover, thereby making it unnecessary to provide any additional fixing means.

Besides the above-mentioned films, it is also possible to use any other films which have the required optical properties, that is to say which enjoy a level of transparency which is as high as possible. The significant consideration in regard to the retroreflective surface of the film in question is that, independently of the angle of incidence, it reflects light coming from the exterior back in the respective direction of incidence to a very high degree.

The electrically activatable light film may involve an electroluminescence film which is operated in the usual manner by an ac voltage which, in the case of a motor vehicle licence plate, can be produced from the onboard dc voltage system by means of a suitable power supply device.

In a particularly preferred configuration however the electrically activatable light film is in the form of a film with organic light emitting diodes, referred to as an OLED film, which affords the advantage that it can be operated with a dc voltage which can be derived from an onboard dc voltage by an extremely simple ancillary circuit. The operating electronics required for an electroluminescence film can be omitted, as well as particular insulating measures. A further advantage of OLED films is the substantially higher level of luminous density which can be achieved in that way.

Further objects, features and advantages of the invention will be apparent from the description hereinafter of a preferred embodiment.

DESCRIPTION OF THE PREFERRED EMBODIMENT

Figure 1:
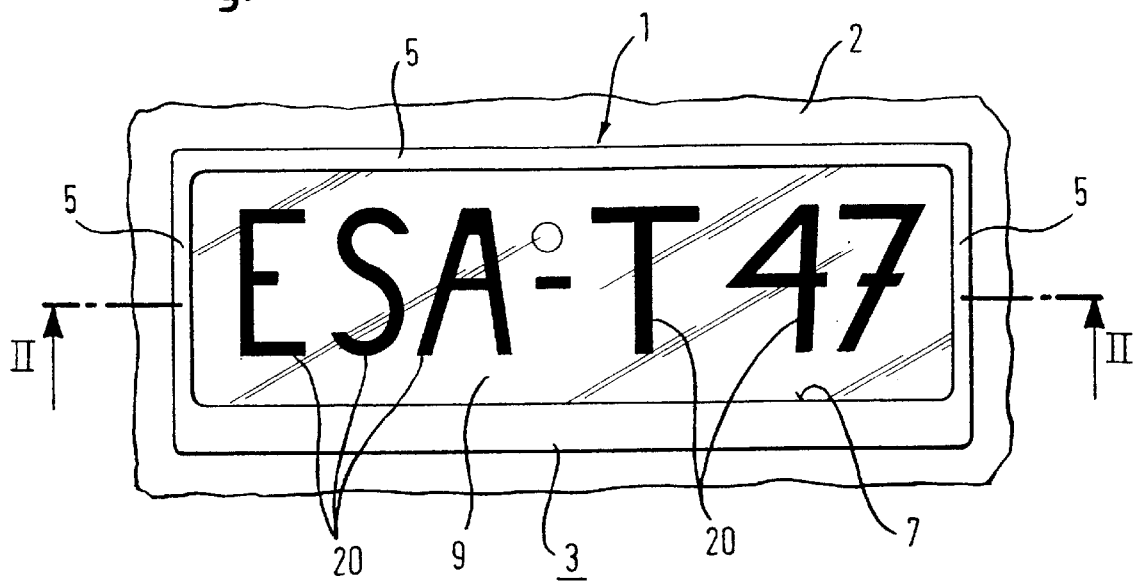
FIG. 1 shows a front view of a plate according to the invention shown in the form of a motor vehicle licence plate.

Referring now to the drawing, reference numeral 1 generally denotes a plate shown in the-form here of a motor vehicle licence plate which can be fixed to a bodywork panel 2 of a motor vehicle in any suitable manner not shown herein.

Figure 2:
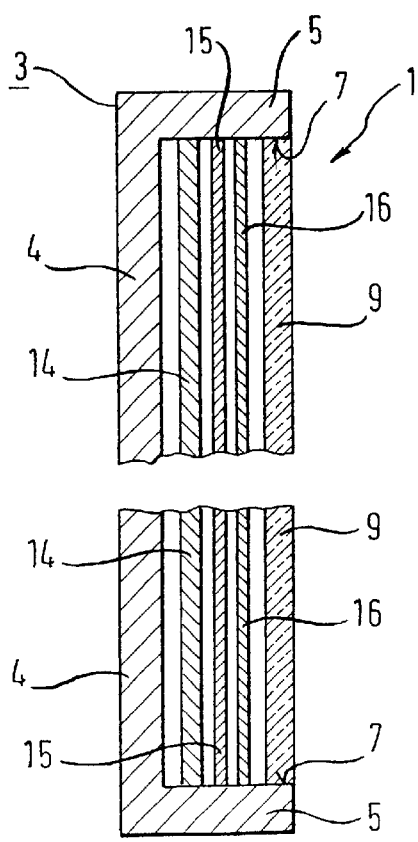
FIG. 2 is a highly diagrammatic view in section through the plate in FIG. 1 taken along line II—II therein.

Looking now more particularly at FIG. 2, it can be seen that the plate 1 comprises a casing 3 with a wall forming a rear wall as indicated at 4 which in turn carries an edge portion 5 extending around the entire periphery of the rear wall 4 and also extending forwardly from the rear wall 4, that is to say towards the right in FIG. 2 and thus towards a person looking at the plate. The edge portion 5 can be joined in one piece to the rear wall 4.

The forwardly projecting edge portion 5 extends around and thus defines a light transmission opening 7 which is closed by a transparent light cover 9 fitted therein. The light cover 9 can be fixed to the peripherally extending edge portion 5 of the casing 3 in any suitable manner.

Disposed between the transparent light cover 9 and the rear wall 4 of the casing 3 are three films 14, 15 and 16 which in the present embodiment are of approximately the same area as the rear wall 4. The films 14, 15 and 16 bear with their flat sides against each other and against the inside surface of the light cover 9 and the inside surface of the rear wall respectively. The spacings shown in FIG. 2 between the respective films and the rear wall 4 and the light cover 9 respectively are shown in exaggerated fashion to make the drawing clearer and in reality are vanishingly small.

The rearmost film which is thus entirely towards the left in FIG. 2 as indicated at 14 is an electrically activatable light film 14 which is connected by suitable connecting means to an electrical power source in such a way that electrical voltage can be applied thereto by means of a suitable switch. The light film 14 is formed either by an electroluminescence film or preferably by an organic light emitting diode film, referred to as an OLED film. In the activated condition the entire film 14 uniformly lights up and the light emitted thereby passes through the films 15 and 16 which are arranged therebeside to the right thereof in FIG. 2 and also through the light cover 9 so that, in the direction of view as shown in FIG. 1, the entire light transmission opening 7 appears to be lit up brightly from behind.

Looking still at FIG. 2, arranged in front of the electrically activatable light film 14, that is to say beside it to the right in FIG. 2, is a retroreflecting film 15 which has its retroreflecting side or surface facing towards the right in FIG. 2. The retroreflective film 15 provides for retroreflection of external light which is incident thereon from the exterior through the light cover 9 and the film 16, in such a way that that light reverses its path and issues through the film 16 and the light cover 9 in substantially the same direction as that in which it passed into the assembly. In addition the retroreflective film 15 is at least partially transparent so that a considerable part of the light emitted by the electrically activatable light film 14 in the direction of the light transmission opening 7 can pass therethrough.

Disposed between the retroreflective film 15 and the inside of the light cover 9 is a further film 16 which, on its two flat sides, carries a slightly roughened layer. The film 16 is transparent to a very high degree such that both the light coming from the interior as is emitted by the electrically activatable light film 14 and also light arriving from the exterior, both prior to and also after reflection thereof at the retroreflective film 15, can pass therethrough without a major loss in intensity.

The rough surfaces of the further foil 16 mean that no local contact or suction effect can occur between the retroreflective foil 15 and the inside of the light cover 9. Without the presence of the further foil 16, those effects which would cause the retroreflective foil 15 to bear against the inside of the light cover 9 would result in the formation of local, markedly delimited dark spots or Newton's rings which would be clearly visible when viewing the plate from the exterior and would adversely affect the appearance of the plate.

Looking more specifically at FIG. 1, the symbols 20 which are shown on the plate and which are thus visible to a person looking at the plate can be disposed on the front and/or rear side of a symbol carrier and differ in terms of their transparency from the other surface regions of the symbol carrier. In the present case they are practically opaque so that they appear black in comparison with the other virtually completely transparent regions of the symbol carrier.

It will be noted here that the above-mentioned symbol carrier does not necessarily involve an additional component. On the contrary the symbols to be represented can be printed on the front side of the retroreflective film 15 or the front or rear side of the further film 16, the film in question thus acting as the symbol carrier. It is equally possible for the symbols 20 to be provided on the inside surface or the outside surface of the light cover 9. There they can also be in the form of raised structures, that is to say structures which project beyond the flat side of the light cover 9 in question.

Figure 3:
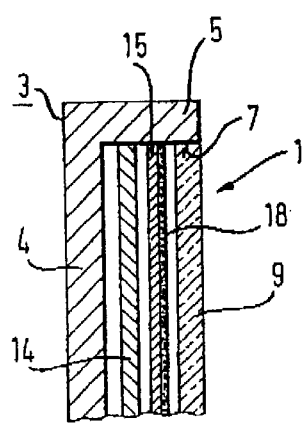
FIG. 3 is a view, similar to FIG. 2, of a second embodiment of a plate according to the invention having a rough coating on the surface of the retro-reflective film.
Figure 4:
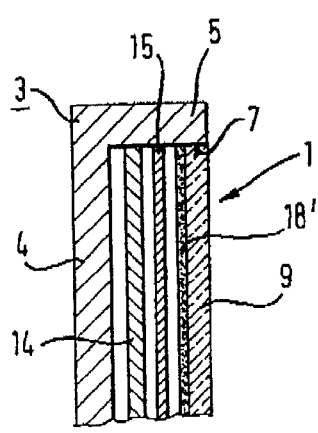
FIG. 4 is a view, similar to FIG. 2, of a third embodiment of a plate according to the invention having a rough coating on the surface of the light cover.
Figure 5:
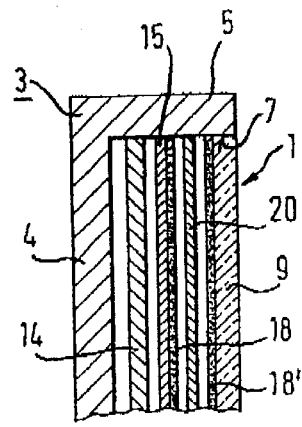
FIG. 5 is a view, similar to FIG. 2, of a fourth embodiment of a plate according to the invention having a separate symbol carrier.

In FIGS. 3, 4 and 5 the same or similar parts shown in FIG. 2 bear the same reference numerals.

FIG. 3 shows a second embodiment of a plate according to the invention, in which the rough layer is in the form of a rough coating 18 covering the right-hand surface of the retro-reflective film 15.

FIG. 4 shows a third embodiment of a plate according to the invention, in which the rough layer is in the form of a rough coating 18' on the left-hand surface of light cover 9.

As shown in FIG. 5, it is also possible to provide an additional symbol carrier 20 which can be in the form of a flat film or plate member to be arranged in front of the retro-reflective film 15. In this case, the rough layer may comprise a rough coating 18 on the right-hand surface of retro-reflective film 15 and/or a rough coating 18' on the left-hand surface of light cover 9.

Depending on the respective purpose of use of the plate according to the invention the symbol carrier may also have more than two transparency graduations. It is also possible for one or more of the films or the outside or inside surface of the light cover 9 to be colored differently in different regions so that here there are further design options which for example also enable a plate according to the invention to be used as a road or traffic sign.

It will be appreciated that the above-described structure has been set forth solely by way of example and illustration of the principles of the present invention and that various other modifications and alterations may be made therein without thereby departing from the spirit and scope of the invention.

What is claimed is:

1. A plate comprising
   a casing including an at least substantially flat first wall forming a rear wall and an edge portion extending around said first wall and projecting forwardly therefrom and defining a light transmission opening for light to pass therethrough,
   a flat symbol carrier which extends parallel to said first wall of the casing with at least one symbol thereon, the symbol carrier having regions of differing transparency to represent the at least one symbol thereon,
   an electrically activatable light film between said first wall and said symbol carrier, said light film being operable for providing illumination at least through the regions of relatively higher transparency of the symbol carrier from the rear thereof,
   a retroreflective film in front of the electrically activatable light film and in parallel relationship therewith, the retroreflective film extending at least over portions of the area of the light transmission opening and being at least partially transparent for light coming from the rear of the retroreflective film from the light film and being retroreflective for light passing from the outside through the light transmission opening and impinging on said retroreflective film,
   a light cover being transparent at least in some areas thereof and closing the light transmission opening, and
   a rough layer between the inward side of the light cover and the surface theretowards of said retroreflective film.

2. A plate as set forth in claim 1
   wherein said rough layer includes a film which is rough on both sides and which is arranged between said retroreflective film and said light cover, said rough film extending in parallel relationship with the retroreflective film at least over a substantial part of the region of the retroreflective film which is visible through the light cover.

3. A plate as set forth in claim 1
   wherein the rough layer includes a rough coating on the surface of the retroreflective film that is towards the light cover.

4. A plate as set forth in claim 1
   wherein the rough layer includes a rough coating on the surface of the light cover that is towards the retroreflective film.

5. A plate as set forth in claim 1
   wherein the light cover serves also as the symbol carrier.

6. A plate as set forth in claim 2
   wherein the rough film also serves as the symbol carrier.

7. A plate as set forth in claim 1
   wherein the retroreflective film also serves as the symbol carrier.

8. A plate as set forth in claim 1
   wherein the symbol carrier is an independent symbol carrier.

9. A plate as set forth in claim 8
   wherein the symbol carrier is in the form of an inherently stiff plate member.

10. plate as set forth in claim 8
    wherein the symbol carrier is a flexible film.

11. A plate as set forth in claim 2
    wherein the light film, the retroreflective film and the rough film are held in a condition of bearing loosely against each other between said first wall of the casing and the light cover.

12. A plate as set forth in claim 1
    wherein the electrically activatable light film is an electroluminescence film.

13. A plate as set forth in claim 1
    wherein the electrically activatable light film is a light film with organic light emitting diodes.

14. A plate as set forth in claim 1 in the form of a motor vehicle licence plate
   wherein the symbol carrier carries vehicle identification symbols.

15. A vehicle licence plate comprising
   a casing including an at least substantially flat first wall having an edge and an edge wall portion extending around said first wall at said edge and projecting therefrom to define an opening for light to pass into and out of said casing,
   a flat symbol carrier extending parallel to said first wall of the casing and having regions of differing transparency to represent at least one symbol thereon,
   an electrically activatable light film between said first wall and said symbol carrier,
   activating means connected to said light film operable for providing illumination at least through the regions of relatively higher transparency of the symbol carrier from the rear thereof,
   a retroreflective film in front of the light film in parallel relationship therewith and extending at least over portions of the area of the opening of the casing and being at least partially transparent for light coming from the rear of the retroreflective film from the light film and being retroreflective for light passing from the outside through the opening of the casing and impinging on said retroreflective film,
   a light cover, transparent in at least some areas thereof, at the opening of the casing, and
   a layer between the inward side of the light cover and the surface theretowards of said retroreflective film, the layer being non-smooth thereby to maintain the retroreflective film in a condition of not bearing over its entire surface area against the adjoining surface of the light cover.

\* \* \* \* \*